(12) United States Patent
Kuo

(10) Patent No.: US 10,938,417 B2
(45) Date of Patent: Mar. 2, 2021

(54) FLASH MEMORY CONTROLLER AND ENCODING CIRCUIT AND DECODING CIRCUIT WITHIN FLASH MEMORY CONTROLLER

(71) Applicant: Silicon Motion Inc., Hsinchu County (TW)

(72) Inventor: Shiuan-Hao Kuo, New Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 16/558,146

(22) Filed: Sep. 1, 2019

(65) Prior Publication Data

US 2020/0153456 A1 May 14, 2020

(30) Foreign Application Priority Data

Nov. 14, 2018 (TW) .............................. 107140313 A

(51) Int. Cl.
*H03M 13/00* (2006.01)
*H03M 13/11* (2006.01)
*G06F 11/10* (2006.01)

(52) U.S. Cl.
CPC ....... *H03M 13/1105* (2013.01); *G06F 11/108* (2013.01); *G06F 11/1012* (2013.01); *G06F 11/1068* (2013.01)

(58) Field of Classification Search
None
See application file for complete search history.

(56) References Cited

U.S. PATENT DOCUMENTS

| 9,037,951 | B2 | 5/2015 | Cideciyan | |
| 2007/0043998 | A1* | 2/2007 | Lakkis | H03M 13/116 714/758 |
| 2010/0268918 | A1* | 10/2010 | Priewasser | H03M 13/6513 712/208 |
| 2010/0325511 | A1* | 12/2010 | Oh | H03M 13/116 714/752 |
| 2011/0214039 | A1* | 9/2011 | Steiner | H03M 13/2927 714/797 |
| 2013/0007561 | A1* | 1/2013 | Motwani | H03M 13/3769 714/758 |
| 2013/0111294 | A1* | 5/2013 | Tan | H03M 5/145 714/755 |
| 2014/0006898 | A1* | 1/2014 | Sharon | G06F 11/1072 714/755 |
| 2016/0283319 | A1 | 9/2016 | Chou | |
| 2019/0114225 | A1* | 4/2019 | Gopalakrishnan | G06F 11/1044 |

FOREIGN PATENT DOCUMENTS

EP 1422829 B1 11/2007

* cited by examiner

*Primary Examiner* — Mujtaba M Chaudry
(74) *Attorney, Agent, or Firm* — Winston Hsu

(57) ABSTRACT

The present invention provides an encoding circuit of a flash memory controller, wherein the encoding circuit includes an auxiliary data generating circuit and an encoder. In the operations of the encoding circuit, the auxiliary data generating circuit is configured to receive a plurality of data chunks to generate auxiliary data corresponding to the data chunks. The encoder is configured to encode the data blocks to generate parity codes according to a parity check matrix, and to use the auxiliary data to replace a portion of the parity codes to generate adjusted parity codes, wherein the data chunks and the adjusted parity codes are written into a flash.

18 Claims, 7 Drawing Sheets

FLASH MEMORY CONTROLLER AND ENCODING CIRCUIT AND DECODING CIRCUIT WITHIN FLASH MEMORY CONTROLLER

BACKGROUND OF THE INVENTION

1. Field of the Invention

The present invention relates to the field of flash memories, and more particularly, to an encoding circuit and a decoding circuit applicable in a flash memory controller.

2. Description of the Prior Art

In related art Low-Density Parity Check code (LDPC) encoders, when the adopted parity check matrix is a non-full-rank parity check matrix, the generated parity code will comprise multiple bits without error correction properties (which is generally called dependent bits), thereby wasting the memory space.

SUMMARY OF THE INVENTION

Hence, an objective of the present invention is to provide an encoding circuit which utilizes the address of bits that originally dependent to store auxiliary data, in order to solve the problem encountered in related art techniques.

An embodiment of the present invention discloses an encoding circuit applicable to a flash memory controller. The encoding circuit comprises an auxiliary data generating circuit and an encoder. The auxiliary data generating circuit is arranged to receive multiple data chunks in order to generate auxiliary data of the data chunks. The encoder is coupled to the auxiliary data generating circuit. The encoder is arranged to encode the data chunks according to a parity check matrix in order to generate a parity code, and replace a portion of the parity code with the auxiliary data in order to generate an adjusted parity code. The data chunks and the adjusted parity code are written into a flash memory.

Another embodiment of the present invention discloses a flash memory controller which is arranged to access a flash memory module. The flash memory controller comprises a memory arranged to store a code, a microprocessor arranged to execute the code in order to control the access of the flash memory module, and an encoding circuit. The encoding circuit comprises an auxiliary data generating circuit and an encoder. The auxiliary data generating circuit is arranged to receive multiple data chunks in order to generate auxiliary data of the data chunks. The encoder is coupled to the auxiliary data generating circuit. The encoder is arranged to encode the data chunks according to a parity check matrix in order to generate a parity code, and replace a portion of the parity code with the auxiliary data in order to generate an adjusted parity code. The data chunks and the adjusted parity code are written into the flash memory module.

Another embodiment of the present invention discloses a decoding circuit applicable to a flash memory controller. The decoding circuit comprises a decoder and a checking circuit. The decoder is arranged to decode data from a flash memory, in order to generate decoded data and a decoded parity code. The checking circuit is coupled to the decoder. The checking circuit is arranged to obtain auxiliary data from the parity code, and determine integrity and correctness of the decoded data according to the auxiliary data in order to generate a check result. When the check result indicates that the integrity and correctness of the decoded data is normal, the decoded data is transmitted to a host device that is coupled to the flash memory controller.

Another embodiment of the present invention discloses a flash memory controller, wherein the flash memory controller is arranged to access a flash memory module, and the flash memory controller comprises a memory arranged to store a code, a microprocessor arranged to execute the code in order to control the access of the flash memory module access, and a decoding circuit. The decoding circuit comprises a decoder and a checking circuit. The decoder is arranged to decode data from a flash memory, in order to generate decoded data and a decoded parity code. The checking circuit is coupled to the decoder. The checking circuit is arranged to obtain auxiliary data from the decoded parity code and determine integrity or correctness of the decoded data according to the auxiliary data, in order to generate a check result. When the check result indicates that the integrity or correctness of the decoded data is normal, the decoded data is transmitted to a host device coupled to the flash memory controller.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
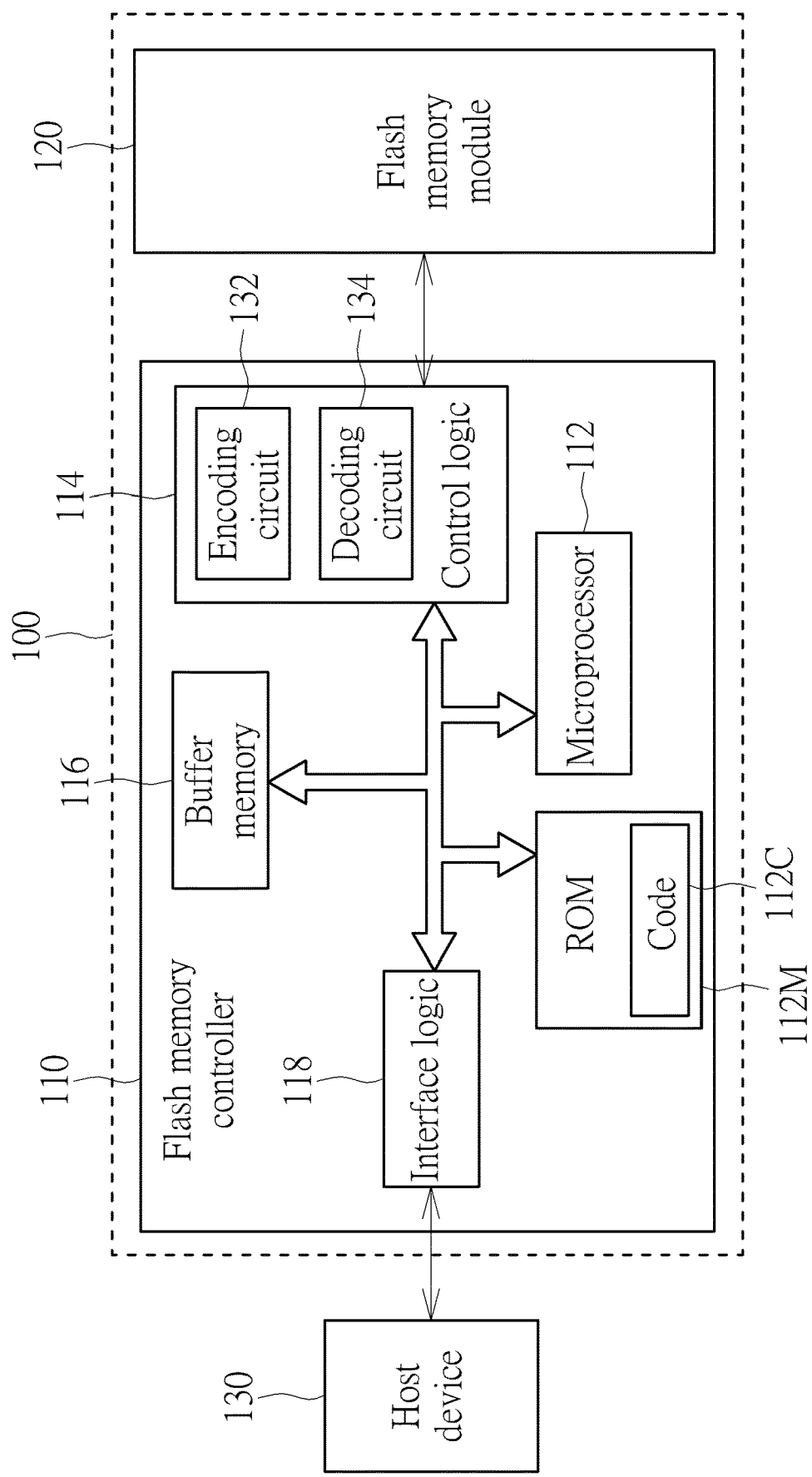
FIG. 1 is a diagram illustrating a memory device according to an embodiment of the present invention.

FIG. 1 is a diagram illustrating a memory device 100 according to an embodiment of the present invention. The memory device 100 comprises a flash memory module 120 and a flash memory controller 110, and the flash memory controller 110 is arranged to access the flash memory module 120. According to this embodiment, the flash memory controller 110 comprises a microprocessor 112, a read-only memory (ROM) 112M, a control logic 114, a buffer memory 116, and an interface logic 118. The ROM 112M is arranged to store a code 112C, and the microprocessor 112 is arranged to execute the code 112C in order to control the access of the flash memory module 120. The control logic 114 comprises an encoding circuit 132 and a decoding circuit 134, wherein the encoding circuit 132 is arranged to encode the data written into the flash memory module 120 in order to generate a corresponding parity code (which can be called as error correction code (ECC)), and the decoder 134 is arranged to decode the data read from the flash memory module 120.

In typical situations, the flash memory module 120 comprises multiple flash memory chips, each comprising a plurality of blocks, and the controller (e.g. the flash memory controller 110 which executes the code 112C through the microprocessor 112) may perform operations such as copying, erasing and merging data, wherein the unit of performing these operations may be "block". Further, a block may comprises a certain number of pages, wherein the controller (e.g. the memory controller 110 which executes the code 112C through the microprocessor 112) may use "page" as the unit of writing data into the flash memory module 120.

In practice, the flash memory controller 110 which executes the code 112C via the microprocessor 112 may utilize its internal elements to perform various control operations, such as: utilizing the control logic 114 to control access operations upon the flash memory module 120 (more particularly the access operation upon at least one block or at least one page), utilizing the buffer memory 116 to perform some necessary buffering processes, and utilizing the interface logic 118 to communicate with a host device 130.

In an embodiment, the memory device 100 may be a portable memory device (e.g. a memory card conforming to the SD/MMC, CF, MS, XD specifications), and host device 130 may be an electronic device connectable to a memory device, such as a smartphone, laptop computer, desktop computer, etc. In another embodiment, the memory device 100 may be configured in an electronic device (e.g. in a smartphone, laptop computer or desktop computer), and the host device 130 in this situation may be a processor of the electronic device.

Figure 2:
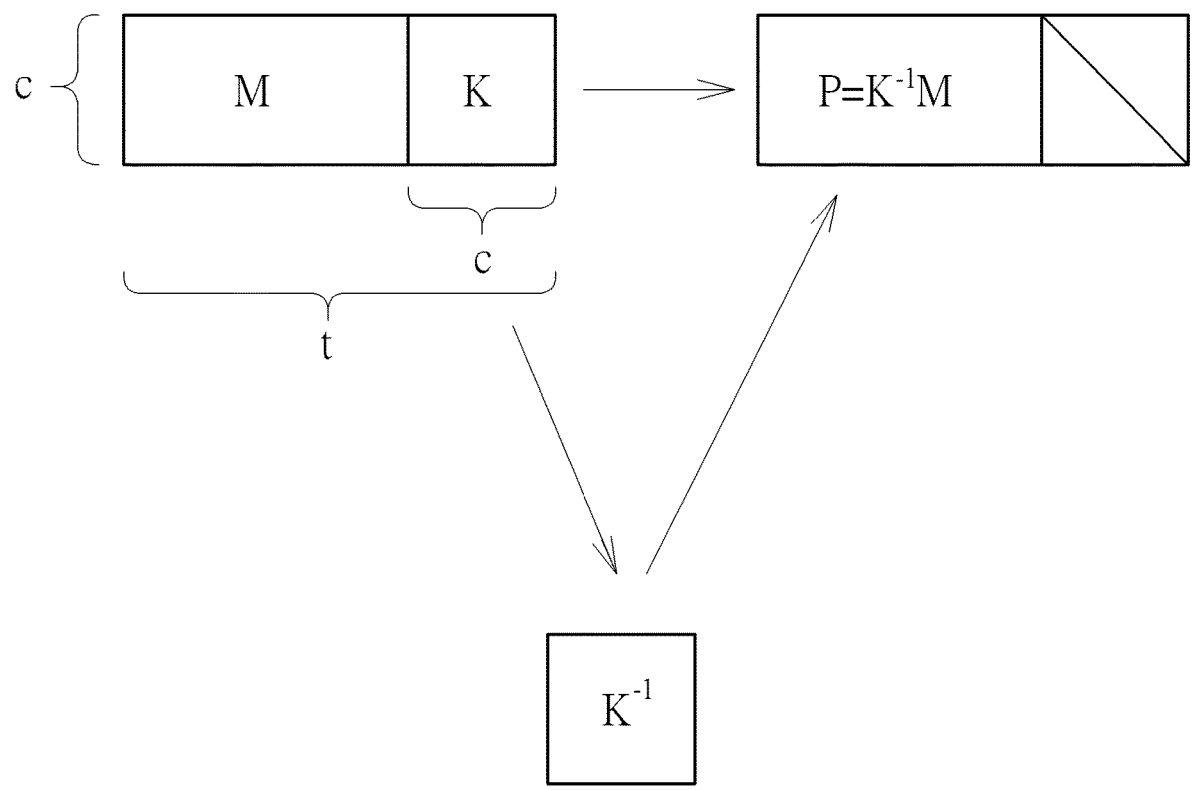
FIG. 2 is a diagram illustrating a parity check matrix and a parity code generating matrix.

In this embodiment, the encoding circuit 132 at least comprises a Low-Density Parity Check code (LDPC) encoder, and may generate corresponding parity codes according to the data from the host device 130, wherein the generated parity code conforms to a parity check matrix. Specifically, please refer to FIG. 2, assuming that the parity check matrix is a c*t matrix (e.g. c=5, t=48, or any other suitable value), and the parity check matrix may be divided into a left-hand side matrix M (with the size of c*(t−c)) and a right-hand side matrix K (with the size of c*c). The inverse matrix $K^{-1}$ of the matrix K may be obtained to find the parity code generating matrix corresponding to the parity check matrix, and then the inverse matrix ($K^{-1}$) may be multiplied by the matrix M in order to obtain the matrix P. Then, the transpose matrix of the matrix P may be viewed as the parity code generating matrix. In other words, after the transpose matrix of the matrix P is found, the encoding circuit 132 may multiply the data from the host device 130 by the transpose matrix of the matrix P in order to obtain the parity code corresponding to said data, and the encoder may later multiply said data as well as the parity code by the parity check matrix in order to determine whether the parity code is correct. For example, if the multiplication result is equal to "0", the encoding will be determined as correct; and if the multiplication result is not equal to "0", the encoding will be determined as incorrect. After the encoding is determined as correct, the data and corresponding parity code will be written into a page in the flash memory module 120.

One thing should be noted is that, in practice, the unit of each of the aforementioned parity check matrices may be "block", and the block may be a square matrix (e.g. a 64*64 matrix or a 192*192 matrix). That is, the parity check matrix comprises c*t blocks.

However, when the parity check matrix is a non-full rank parity check matrix, the rank of the inverse matrix $K^{-1}$ will be lower than the numbers of the columns/rows of the inverse matrix $K^{-1}$. For example, the rank of the inverse matrix $K^{-1}$ may be (c-x), wherein x is a positive integer and may vary with different parity check metrics, e.g. x=3, x=5, etc. However, since the rank of the inverse matrix $K^{-1}$ may be lower than the column/row numbers of the inverse matrix $K^{-1}$, the parity code generated by the encoding circuit 132 may comprise some dependent bits, i.e. the bits that are not error-correctable. The encoding circuit 132 in this embodiment may utilize the addresses of the original dependent bits to store the auxiliary data, and thereby avoids wasting the memory space.

Figure 3:
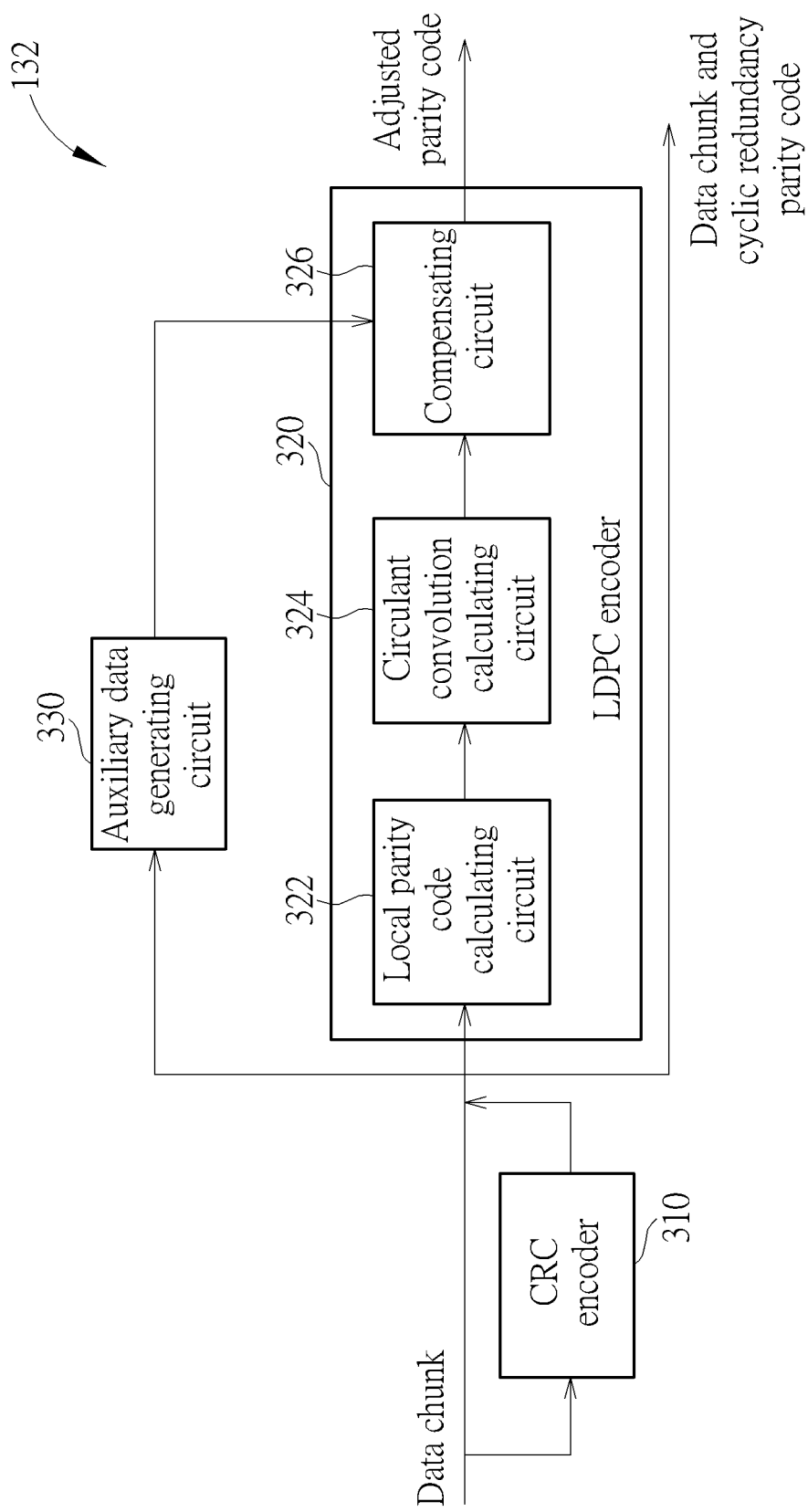
FIG. 3 is a diagram illustrating an encoding circuit according to an embodiment of the present invention.

Please refer to FIG. 3, which is a diagram illustrating an encoding circuit 132 according to an embodiment of the present invention. As shown in FIG. 3, the encoding circuit 132 comprises a cyclic redundancy check (CRC) encoder 310, a LDPC encoder 320 and an auxiliary data generating circuit 330, wherein the LDPC encoder 320 comprises a local parity code calculating circuit 322, a circulant convolution calculating circuit 324 and a compensating circuit 326. In this embodiment, the local parity code calculating circuit 322 may be a comparison of the matrix M shown in FIG. 2, and the circulant convolution calculating circuit 324 is arranged to generate content similar to that of the inverse matrix $K^{-1}$ shown in FIG. 2. Since the local parity code calculating circuit 322 and the circulant convolution calculating circuit 324 involves in complicated circuit designs and mathematical computations and the present invention does not focus on circuit designs of the LDPC encoder 320, the detailed circuit architecture designs of the LDPC encoder 320, the local parity code calculating circuit 322 and the circulant convolution calculating circuit 324 are omitted here for brevity. However, for better understanding, the TW application No. 106141115 which introduces some related complicated circuit designs and mathematical computations can be referred as a reference.

In the operations of the encoding circuit 132 shown in FIG. 3, firstly, the cyclic redundancy check encoder 310 may perform cyclic redundancy check encoding on multiple data chunks in order to generate a cyclic redundancy parity code. Next, the local parity code calculating circuit 322 and the circulant convolution calculating circuit 324 in the LDPC encoder 320 sequentially encode the data chunks and the cyclic redundancy parity code in order to generate a parity code, wherein the parity code comprises at least one dependent bit. Meanwhile, the auxiliary data generating circuit 330 generates auxiliary data according to the data chunks and/or the cyclic redundancy parity code. After that, the compensating circuit 326 replaces at least one dependent bit of the parity code with the auxiliary data in order to generate an adjusted parity code. Finally, the encoding circuit 132 writes the data chunk, the cyclic redundancy parity code and the adjusted parity code altogether to a page of a block in the flash memory module 120.

In an embodiment, the auxiliary data generated by the auxiliary data generating circuit 330 is an identification (ID), hash data, Quality of Service (QoS) information, time stamp, or logical/physical address of the data chunks. In another embodiment, the cyclic redundancy parity code generated by the cyclic redundancy check encoder 310 comprises a first portion and a second portion, wherein the first portion is right behind the data chunks, and the second portion is used as the auxiliary data to replace dependent bits in the parity code. In another embodiment, the auxiliary data may also be the remainder of dividing the number of all bits "1" (or bits "0") by a reference value, but the present invention is not limited thereto.

Figure 4:
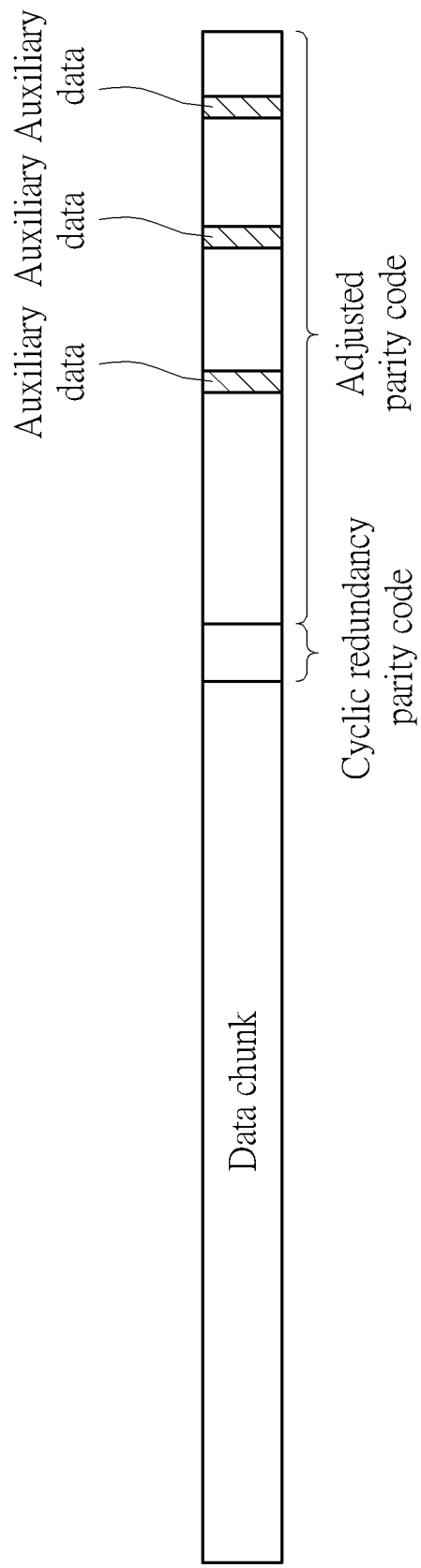
FIG. 4 is a diagram illustrating the data chunk, cyclic redundancy parity code and adjusted parity code written into the flash memory module.

FIG. 4 is a diagram illustrating the data chunk, cyclic redundancy parity code and adjusted parity code written into the flash memory module 120. As shown in FIG. 4, data chunks are followed by the cyclic redundancy parity code, and the cyclic redundancy parity code is followed by the adjusted parity code. The shaded regions are addresses of dependent bits originally in the parity code, and the auxiliary data is used to replace dependent bits originally in the parity code in order to generate the adjusted parity code.

In the embodiments of FIGS. 3 and 4, by replacing the dependent bits in the parity code having no correction effect with auxiliary data that has actual correction effect, the goal of making limited space have more useful information can be achieved, thereby avoiding the inefficient use of the memory space.

Figure 5:
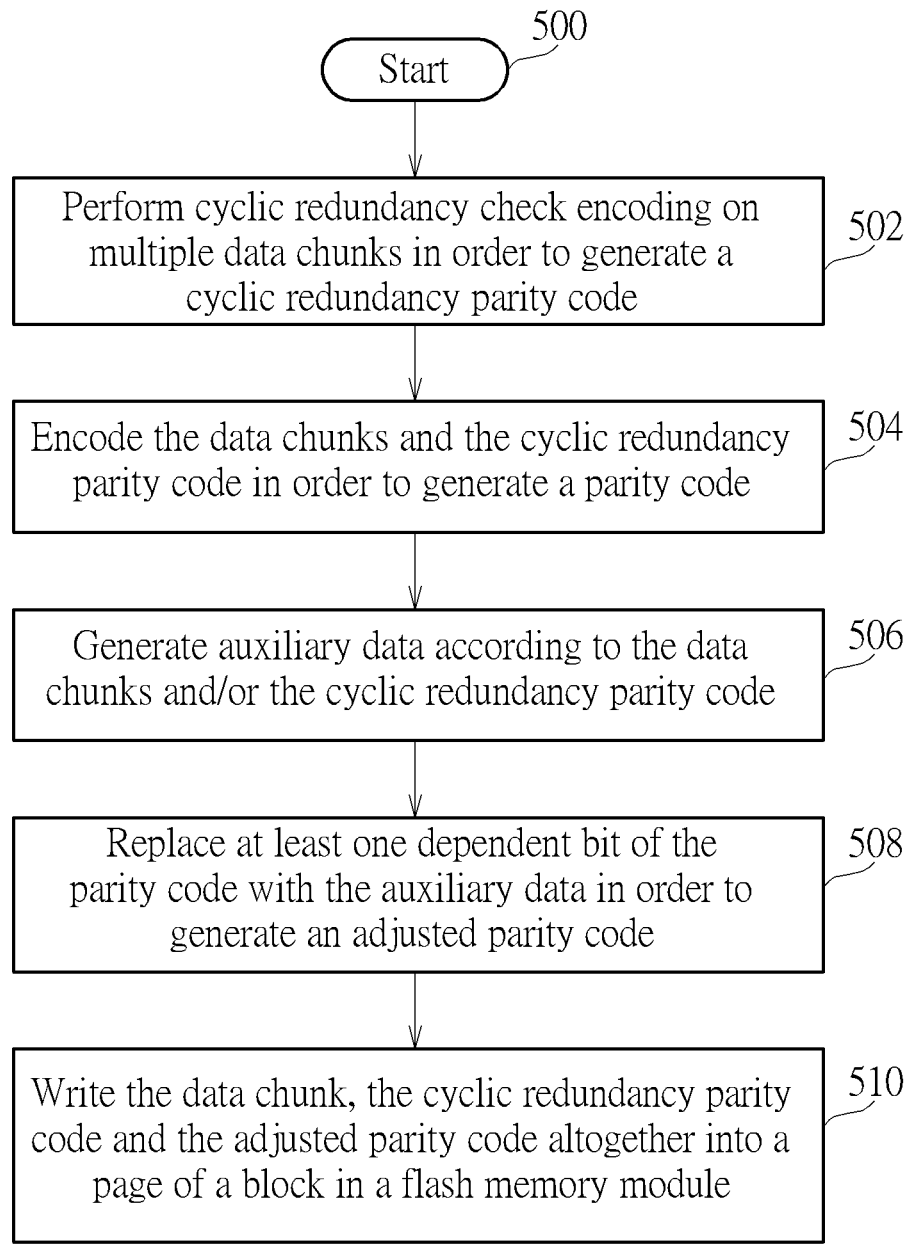
FIG. 5 is a flowchart illustrating an encoding method according to an embodiment of the present invention.

FIG. 5 is a flowchart illustrating an encoding method according to an embodiment of the present invention. The flow of the encoding method is as follows, and is based on FIGS. 1-4 and related contents of the specification.

Step 500: The flow begins.

Step 502: Perform cyclic redundancy check encoding on multiple data chunks in order to generate a cyclic redundancy parity code.

Step 504: Encode the data chunks and the cyclic redundancy parity code in order to generate a parity code.

Step 506: Generate auxiliary data according to the data chunks and/or the cyclic redundancy parity code.

Step 508: Replace at least one dependent bit of the parity code with the auxiliary data in order to generate an adjusted parity code.

Step 510: Write the data chunk, the cyclic redundancy parity code and the adjusted parity code altogether into a page of a block in a flash memory module.

Figure 6:
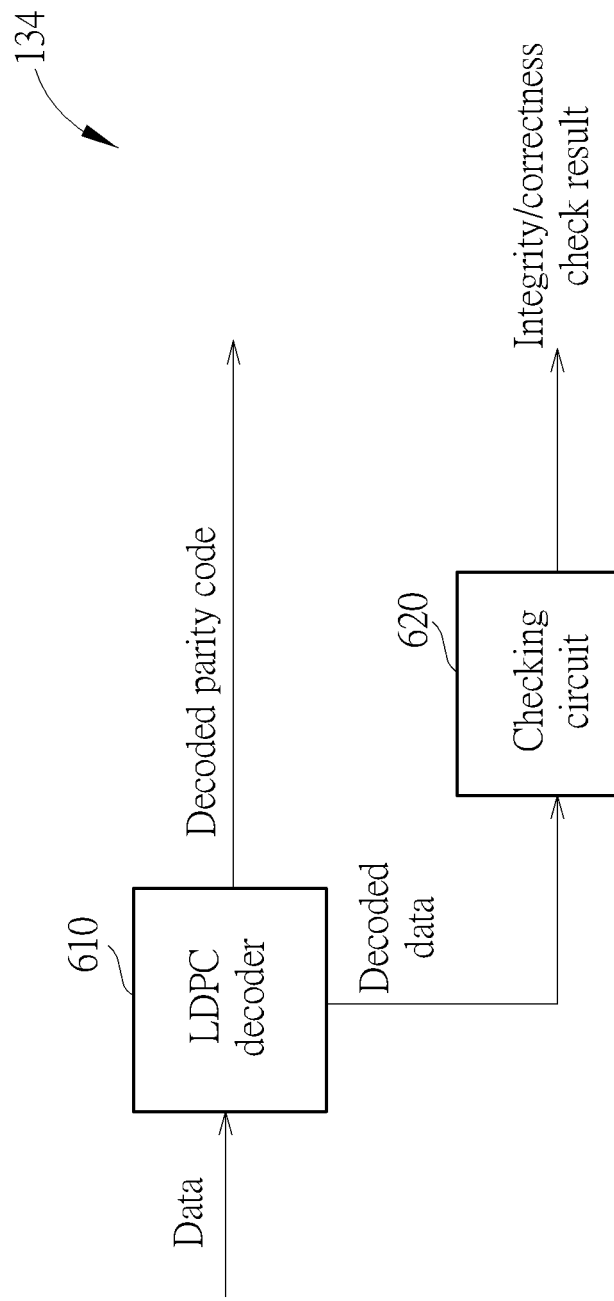
FIG. 6 is a diagram illustrating a decoding circuit according to an embodiment of the present invention.

FIG. 6 is a diagram illustrating a decoding circuit 134 according to an embodiment of the present invention. As shown in FIG. 6, the decoding circuit 134 comprises an LDPC decoder 610 and a checking circuit 620. In the operations of the decoding circuit 134, firstly, in response to a read command from the host device 130, the LDPC decoder 610 reads data from a page of a block in the flash memory module 120, and then decodes the data in order to generate decoded data and a decoded parity code, wherein the decoded data may be the data chunk and the cyclic redundancy parity code shown in FIG. 4, and the decoded parity code may be an adjusted parity code of FIG. 4. Next, the checking circuit 620 obtains auxiliary data (such as the shaded regions shown in FIG. 4, wherein the address is known information of the encoding circuit 132 and decoding circuit 134) from the decoded parity code, and utilizes the auxiliary data to determine the integrity/correctness of the decoded data in order to generate a check result. In one embodiment, when the check result indicates that the integrity or correctness of the decoded data is normal, the microprocessor 112 will send the decoded data to the host device 130.

In one embodiment, the checking circuit 620 may be a cyclic redundancy check decoder, wherein the checking circuit 620 may obtain a first portion of cyclic redundancy parity code from the decoded data, the checking circuit 620 may obtain a second portion of cyclic redundancy parity code (i.e. the auxiliary data) from the decoded parity code, and the checking circuit 620 may use the first portion of cyclic redundancy parity code and the second portion of cyclic redundancy parity code to determine the integrity or correctness of the decoded data in order to generate the check result. As mentioned above, since the decoded parity code also comprises a portion of the content of the cyclic redundancy parity code, when the bits of the cyclic redundancy parity code are many, this embodiment may ensures higher accuracy of the integrity/correctness check.

Figure 7:
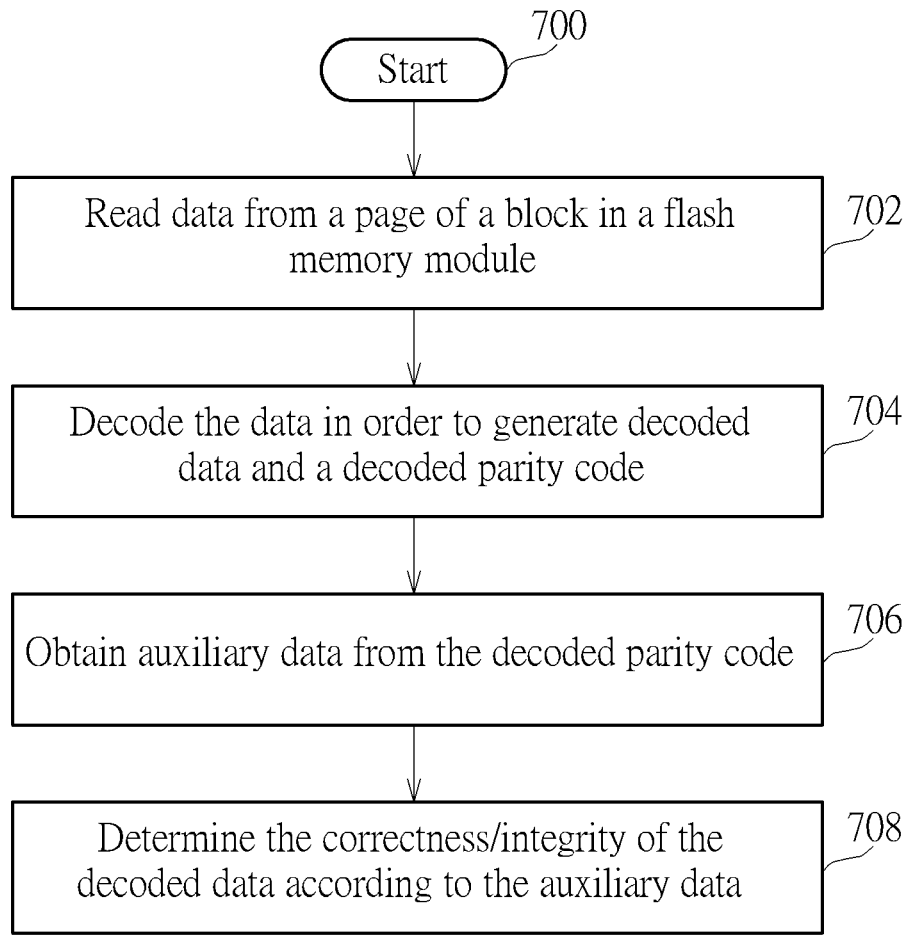
FIG. 7 is a flowchart illustrating a decoding method according to an embodiment of the present invention.

FIG. 7 is a flowchart illustrating a decoding method according to an embodiment of the present invention. The flow of the encoding method is as follows, and is based on FIGS. 4 and 6 and related contents of the specification.

Step 700: The flow begins.

Step 702: Read data from a page of a block in a flash memory module.

Step 704: Decode the data in order to generate decoded data and a decoded parity code.

Step 706: Obtain auxiliary data from the decoded parity code.

Step 708: Determine the correctness/integrity of the decoded data according to the auxiliary data.

To summarize, the flash memory controller, as well as the associated encoding circuit and the decoding circuit, are arranged to replace the dependent bit in the parity code originally generated by the encoding circuit with the auxiliary data that has substantial functions, in order to more sufficiently utilize the memory space without leaving the space unused. On the other hand, by adding auxiliary data into the parity code, the correctness/integrity check of the entire decoding process can be ensured to have a higher accuracy.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An encoding circuit applicable to a flash memory controller, comprising:
   an auxiliary data generating circuit, arranged to receive multiple data chunks in order to generate auxiliary data of the data chunks; and
   an encoder comprising a local parity code calculating circuit, a circulant convolution calculating circuit and a compensating circuit, wherein the local parity code calculating circuit receives the data chunks, the local parity code calculating circuit and the circulant convolution calculating circuit are arranged to encode the data chunks according to a parity check matrix in order to generate a parity code, and the compensating circuit receives the auxiliary data from the auxiliary data generating circuit to replace a portion of the parity code with the auxiliary data in order to generate an adjusted parity code;
   wherein the data chunks and the adjusted parity code are written into a flash memory.

2. The encoding circuit of claim 1, wherein the parity check matrix is a non-full rank parity check matrix, and the portion of the parity code is multiple bits without error correction function properties.

3. The encoding circuit of claim 1, wherein the encoder is a low-density parity check (LDPC) code encoder in the flash memory controller.

4. The encoding circuit of claim 1, further comprising:
   a cyclic redundancy check (CRC) encoder, arranged to encode the data chunks in order to generate a cyclic redundancy parity code;
   wherein the auxiliary data generating circuit generates the auxiliary data according to a portion of the cyclic redundancy parity code.

5. The encoding circuit of claim 4, wherein the encoder encodes the data chunks and the cyclic redundancy parity code altogether in order to generate the parity code, wherein a portion of the cyclic redundancy parity code is used to replace the portion of the parity code in order to generate the adjusted parity code.

6. The encoding circuit of claim 1, wherein the auxiliary data is identification (ID) information, hash data, quality of service (QoS) information, or logical/physical address of the data chunks.

7. A flash memory controller, arranged to access a flash memory module, comprising:
   a memory, arranged to store a code;
   a microprocessor, arranged to execute the code in order to control the access of the flash memory module; and
   an encoding circuit, comprising:
      an auxiliary data generating circuit, arranged to receive multiple data chunks in order to generate auxiliary data of the data chunks; and
      an encoder comprising a local parity code calculating circuit, a circulant convolution calculating circuit and a compensating circuit, wherein the local parity code calculating circuit receives the data chunks, the local parity code calculating circuit and the circulant convolution calculating circuit are arranged to encode the data chunks according to a parity check matrix in order to generate a parity code, and the compensating circuit receives the auxiliary data from the auxiliary data generating circuit to replace a portion of the parity code with the auxiliary data in order to generate an adjusted parity code;
      wherein the data chunks and the adjusted parity code are written into the flash memory module.

8. The flash memory controller of claim 7, wherein the parity check matrix is a non-full rank parity check matrix, and the portion of the parity code is multiple bits without any error correction property.

9. The flash memory controller of claim 7, wherein the encoder is a Low-Density Parity Check (LDPC) code encoder in the flash memory controller.

10. The flash memory controller of claim 7, further comprising:
    a cyclic redundancy check encoder, arranged to encode the data chunks in order to generate a cyclic redundancy parity code;
    wherein the auxiliary data generating circuit generates the auxiliary data according to a portion of the cyclic redundancy parity code.

11. The flash memory controller of claim 10, wherein the encoder encodes the data chunks and the cyclic redundancy parity code altogether in order to generate the parity code, wherein a portion of the cyclic redundancy parity code is used to replace the portion of the parity code in order to generate the adjusted parity code.

12. The flash memory controller of claim 7, wherein the auxiliary data is identification (ID) information, hash data, quality of service (QoS) information, or logical/physical address of the data chunks.

13. A decoding circuit applicable to a flash memory controller, wherein the flash memory controller comprises an encoding circuit, and the encoding circuit comprises:
    an auxiliary data generating circuit, arranged to receive multiple data chunks in order to generate auxiliary data of the data chunks; and
    an encoder comprising a local parity code calculating circuit, a circulant convolution calculating circuit and a compensating circuit, wherein the local parity code calculating circuit receives the data chunks, the local parity code calculating circuit and the circulant convolution calculating circuit are arranged to encode the data chunks according to a parity check matrix in order to generate a parity code, and the compensating circuit receives the auxiliary data from the auxiliary data generating circuit to replace a portion of the parity code with the auxiliary data in order to generate an adjusted parity code; wherein the data chunks and the adjusted parity code are written into a flash memory; and
    the decoding circuit comprising:
       a decoder, arranged to decode data from the flash memory, in order to generate decoded data and a decoded parity code, wherein the data comprises the data chunks and the adjusted parity codes; and
       a checking circuit, coupled to the decoder, the checking circuit arranged to obtain the auxiliary data from the decoded parity code, and determine integrity and correctness of the decoded data according to the auxiliary data in order to generate a check result;
       wherein when the check result indicates that the integrity and correctness of the decoded data is normal, the decoded data is transmitted to a host device that is coupled to the flash memory controller.

14. The decoding circuit of claim 13, wherein the decoder is a Low-Density Parity Check code (LDPC) decoder in the flash memory controller.

15. The decoding circuit of claim 13, wherein the checking circuit is a cyclic redundancy check (CRC) decoder, and the checking circuit obtains a first portion of cyclic redundancy parity code from the decoded data, and the auxiliary data obtained from the decoded parity code by the checking circuit is a second portion of cyclic redundancy parity code, and the checking circuit uses the first portion of cyclic redundancy parity code and the second portion of cyclic redundancy parity code to determine integrity and correctness of the decoded data, in order to generate the check result.

16. A flash memory controller, wherein the flash memory controller is arranged to access a flash memory module, and the flash memory controller comprises:
    a memory, arranged to store a code;
    a microprocessor, arranged to execute the code in order to control the access of the flash memory module access;
    an encoding circuit, comprising:
       an auxiliary data generating circuit, arranged to receive multiple data chunks in order to generate auxiliary data of the data chunks; and
    an encoder comprising a local parity code calculating circuit, a circulant convolution calculating circuit and a compensating circuit, wherein the local parity code calculating circuit receives the data chunks, the local parity code calculating circuit and the circulant convolution calculating circuit are arranged to encode the data chunks according to a parity check matrix in order to generate a parity code, and the compensating circuit receives the auxiliary data from the auxiliary data generating circuit to replace a portion of the parity code with the auxiliary data in order to generate an adjusted parity code; wherein the data chunks and the adjusted parity code are written into the flash memory module; and
    a decoding circuit, comprising:
       a decoder, arranged to decode data from the flash memory module, in order to generate decoded data and a decoded parity code, wherein the data comprises the data chunks and the adjusted parity codes; and
       a checking circuit, coupled to the decoder, the checking circuit arranged to obtain the auxiliary data from the decoded parity code and determine integrity or correctness of the decoded data according to the auxiliary data, in order to generate a check result;
wherein when the check result indicates that the integrity or correctness of the decoded data is normal, the decoded data is transmitted to a host device coupled to the flash memory controller.

17. The decoding circuit of claim 16, wherein the decoder is a Low-Density Parity Check code (LDPC) decoder in the flash memory controller.

18. The decoding circuit of claim 16, wherein the checking circuit is a cyclic redundancy check (CRC) decoder, and the checking circuit obtains a first portion of cyclic redundancy parity code from the decoded data, and the auxiliary data obtained from decoded parity code by the checking circuit is a second portion of cyclic redundancy parity code, and the checking circuit uses the first portion of cyclic redundancy parity code and the second portion of cyclic redundancy parity code to determine integrity or correctness of the decoded data, in order to generate the check result.

* * * * *